(12) United States Patent
Khashaba et al.

(10) Patent No.: US 11,204,888 B2
(45) Date of Patent: Dec. 21, 2021

(54) SYSTEM AND METHOD FOR CONTROLLING CDR AND CTLE PARAMETERS

(71) Applicant: Samsung Display Co., Ltd., Yongin-si (KR)

(72) Inventors: Amr Khashaba, Champaign, IL (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/848,819

(22) Filed: Apr. 14, 2020

(65) Prior Publication Data
US 2021/0248103 A1    Aug. 12, 2021

Related U.S. Application Data

(60) Provisional application No. 62/975,540, filed on Feb. 12, 2020.

(51) Int. Cl.
*G06F 13/42*     (2006.01)
*H03M 1/00*     (2006.01)
(Continued)

(52) U.S. Cl.
CPC ........ *G06F 13/4282* (2013.01); *H03M 1/001* (2013.01); *H03M 1/0697* (2013.01);
(Continued)

(58) Field of Classification Search
CPC . G06F 13/4282; H03M 1/001; H03M 1/0697; H03M 1/1245; H03M 1/22; H03M 1/34
(Continued)

(56) References Cited

U.S. PATENT DOCUMENTS 7,325,175 B2   1/2008   Momtaz
8,791,735 B1   7/2014   Shibasaki
(Continued)

FOREIGN PATENT DOCUMENTS

GB          2504110 A       1/2014

OTHER PUBLICATIONS

Shibasaki, Takayuki et al., "A 56Gb/s NRZ-Electrical 247mW/lane Serial-Link Transceiver in 28nm CMOS", IEEE International Solid-State Circuits Conference, Session 3, Ultra-High-Speed Transceivers, Feb. 1, 2016, 3 pages, IEEE.

(Continued)

*Primary Examiner* — Paul R. Myers
(74) *Attorney, Agent, or Firm* — Lewis Roca Rothgerber Christie LLP

(57) ABSTRACT

A circuit for receiving serial data. In some embodiments, the circuit has an input for receiving an analog input signal, and includes a first sampler for sampling the analog input signal relative to a first reference voltage, a second sampler for sampling the analog input signal relative to a second reference voltage, and a reference voltage control circuit. The second reference voltage may have a sign opposite to that of the first reference voltage; and the reference voltage control circuit may be configured to adjust the first reference voltage or the second reference voltage, based on a first sample of the analog input signal, the first sample having been taken at a sampling time corresponding to a one bit, in the serial data, preceded by a one bit and followed by a one bit.

20 Claims, 13 Drawing Sheets

(51) Int. Cl.
  *H03M 1/06* (2006.01)
  *H03M 1/12* (2006.01)
  *H03M 1/22* (2006.01)
  *H03M 1/34* (2006.01)

(52) U.S. Cl.
  CPC ........... *H03M 1/1245* (2013.01); *H03M 1/22* (2013.01); *H03M 1/34* (2013.01)

(58) Field of Classification Search
  USPC ....................................................... 710/100
  See application file for complete search history.

(56) References Cited

U.S. PATENT DOCUMENTS

| | | | |
|---|---|---|---|
| 8,879,616 B2 * | 11/2014 | Zhou | H04L 25/03248 375/229 |
| 8,958,512 B1 | 2/2015 | Ding et al. | |
| 8,970,976 B1 * | 3/2015 | Hwang | G11B 20/10009 360/39 |
| 9,160,582 B1 | 10/2015 | Huss et al. | |
| 9,209,966 B1 | 12/2015 | Hossain et al. | |
| 9,397,872 B2 | 7/2016 | Kamali | |
| 9,602,116 B1 * | 3/2017 | Le | H03M 1/121 |
| 9,654,327 B2 | 5/2017 | Liao et al. | |
| 9,674,013 B2 | 6/2017 | Patel et al. | |
| 10,742,227 B1 * | 8/2020 | Schifmann | H03F 3/45475 |
| 10,785,015 B1 * | 9/2020 | Rada | H04L 7/0087 |
| 10,785,070 B1 * | 9/2020 | Takada | H04L 25/03885 |
| 10,848,350 B1 * | 11/2020 | Hossain | H04L 7/0087 |
| 2007/0086301 A1 * | 4/2007 | Yamakawa | G11B 20/10046 369/59.22 |
| 2009/0232195 A1 | 9/2009 | Ozawa | |
| 2013/0169314 A1 * | 7/2013 | Choudhary | H04L 25/03057 327/91 |
| 2013/0188656 A1 | 7/2013 | Ferraiolo et al. | |
| 2013/0301695 A1 | 11/2013 | Nishi | |
| 2014/0064351 A1 * | 3/2014 | Hidaka | H04L 25/03057 375/232 |
| 2014/0146868 A1 * | 5/2014 | Peng | H04L 25/03057 375/233 |
| 2015/0067685 A1 * | 3/2015 | Yang | G06F 9/46 718/100 |
| 2018/0337806 A1 | 11/2018 | Farjad-Rad | |
| 2018/0375693 A1 | 12/2018 | Zhou et al. | |
| 2019/0312756 A1 | 10/2019 | Musah et al. | |
| 2020/0007379 A1 * | 1/2020 | Patil | H04L 27/06 |
| 2020/0052933 A1 * | 2/2020 | Lee | H04L 25/0272 |

OTHER PUBLICATIONS

Yoo, Danny et al., "A 36Gb/s Adaptive Baud-Rate CDR with CTLE and 1-Tap DFE in 28nm CMOS", IEEE International Solid-State Circuits Conference, Session 6, Ultra-High-Speed Wireline, Feb. 18, 2019, 3 pages, IEEE.

Kim, Dongwook et al., "A 15-GB/s Sub-Baud-Rate Digital CDR," IEEE Journal of Solid-State Circuits, vol. 54, No. 3, 2019, pp. 685-695.

Li, Yue et al., "Sign3-LMS data-transition decision feedback equaliser," Ie I Circuits, Devices and Systems, vol. 13, 2019, pp. 998-1006.

Malhotra, Gaurav, et al., "Symbol spaced clock recovery for high speed links," IEEE, 2019, 5 pages.

Yoo, Danny et al., "A 36-GB/s Adaptive Baud-Rate CDR with CTLE and 1-Tap DFE in 28-nm CMOS," IEEE Solid-State Circuits Letters, vol. 2, No. 11, 2019, pp. 252-255.

* cited by examiner $$\frac{V_{OUT}(s)}{V_{IN}(s)} = A_0 \frac{1 + s/w_z}{(1 + s/w_{p1})(1 + s/w_{p2})}$$

$$w_z = \frac{1}{R_S C_S}, \quad w_{p1} = \frac{1 + g_m R_s/2}{R_S C_S}, \quad w_{p2} = \frac{1}{R_D C_D},$$

$$A_0 = \frac{g_m R_D}{1 + g_m R_s/2}, \quad \text{Ideal peak gain} = g_m R_D,$$

$$\text{Ideal peaking} = \frac{\text{Ideal peak gain}}{A_0} = \frac{w_{p1}}{w_z} = 1 + g_m R_s/2$$

*FIG. 3C*

SYSTEM AND METHOD FOR CONTROLLING CDR AND CTLE PARAMETERS

CROSS-REFERENCE TO RELATED APPLICATION(S)

The present application claims priority to and the benefit of U.S. Provisional Application No. 62/975,540, filed Feb. 12, 2020, entitled "ADAPTATION FOR BAUD-RATE LOOP UNROLLED CDR", the entire content of which is incorporated herein by reference.

FIELD

One or more aspects of embodiments according to the present disclosure relate to serial data transmission, and more particularly to a system and method for controlling parameters of a clock and data recovery circuit (CDR) and of a continuous time linear equalizer (CTLE).

BACKGROUND

Baud-rate receivers for serial data may be advantageous in that a single clock phase may be used, and, therefore, phase interpolators may not be needed. Such receivers, however, may use parameters, such as reference voltages, that may be controlled by other circuits. Similarly, it may be advantageous to control the parameters of a continuous time linear equalizer.

Thus, there is a need for a system and method for controlling CDR and CTLE parameters.

SUMMARY

According to an embodiment of the present invention, there is provided a circuit for receiving serial data, the circuit having an input for receiving an analog input signal and including: a first sampler for sampling the analog input signal relative to a first reference voltage; a second sampler for sampling the analog input signal relative to a second reference voltage, the second reference voltage having a sign opposite to that of the first reference voltage; and a reference voltage control circuit configured to adjust the first reference voltage or the second reference voltage, based on a first sample of the analog input signal, the first sample taken at a sampling time corresponding to a one bit, in the serial data, preceded by a one bit and followed by a one bit.

In some embodiments, the magnitude of the second reference voltage equals the magnitude of the first reference voltage.

In some embodiments: the reference voltage control circuit is configured to adjust a third reference voltage based on the first sample, and the first reference voltage is equal to a function of the third reference voltage.

In some embodiments, the second reference voltage is equal to a function of the third reference voltage.

In some embodiments: the first reference voltage is equal to a first fraction of the third reference voltage, the first fraction being within 20% of ⅓, and the second reference voltage is equal to a second fraction of the third reference voltage, the second fraction being within 20% of −⅓.

In some embodiments, the adjusting of the third reference voltage includes: increasing the third reference voltage when the first sample is greater than the third reference voltage, and decreasing the third reference voltage when the first sample is less than the third reference voltage.

In some embodiments, the reference voltage control circuit includes: a third sampler for sampling the analog input signal relative to the third reference voltage; a first pattern filter to select a bit pattern including three consecutive one bits; and a first accumulator for accumulating, in a register of the first accumulator, output values of the third sampler for samples corresponding to the second bit of each pattern matched by the first pattern filter.

In some embodiments, the output of the first pattern filter is used to adapt the DFE coefficients of an order greater than 1.

In some embodiments, the reference voltage control circuit further includes a digital to analog converter for generating the third reference voltage from the register of the first accumulator.

In some embodiments, the circuit further includes a continuous time linear equalizer connected to the input.

In some embodiments, the circuit further includes an equalizer control circuit, connected to, and configured to control one or more control parameters of, the continuous time linear equalizer.

In some embodiments, the equalizer control circuit includes: a fourth sampler for sampling the analog input signal relative to a fourth reference voltage; a second pattern filter to select a bit pattern including a one bit preceded by a zero bit and followed by a zero bit; a second accumulator for accumulating, in a register of the second accumulator, output values of the fourth sampler for samples corresponding to the second bit of each pattern matched by the second pattern filter; and a digital to analog converter for generating the fourth reference voltage from the register of the second accumulator.

In some embodiments, the equalizer control circuit further includes: a fifth sampler for sampling the analog input signal relative to a fifth reference voltage; a third pattern filter to select a bit pattern including a one bit preceded by a zero bit and followed by a zero bit; a third accumulator for accumulating, in a register of the third accumulator, weighted output values of the fifth sampler for samples corresponding to the second bit of each pattern matched by the third pattern filter; and a digital to analog converter for generating the fifth reference voltage from the register of the third accumulator.

In some embodiments, a weight for weighting positive sampler output values is within 20% of 0.16 and a weight for weighting negative sampler output values is within 20% of 0.84.

In some embodiments, the circuit further includes a processing circuit configured to calculate a bit error rate indicator, based on: the register of the first accumulator, the register of the second accumulator, and the register of the third accumulator.

In some embodiments, the processing circuit is configured to: calculate the bit error rate indicator for each of a plurality of settings of the one or more control parameters of the continuous time linear equalizer, and set the control parameters to a setting for which the bit error rate indicator is greatest.

According to an embodiment of the present invention, there is provided a circuit for receiving serial data, the circuit having an input for receiving an analog input signal and including: a baud-rate clock and data recovery circuit; and a reference voltage control circuit for controlling a first reference voltage or a second reference voltage of the baud-rate clock and data recovery circuit, wherein the reference voltage control circuit includes: a first sampler for sampling the analog input signal relative to a third reference voltage; a first pattern filter to select a bit pattern including three consecutive one bits; and a first accumulator for accumulating, in a register of the first accumulator, output values of the first sampler for samples corresponding to the second bit of each pattern matched by the first pattern filter. In some embodiments, the reference voltage control circuit further includes a digital to analog converter for generating the third reference voltage from the register of the first accumulator.

In some embodiments: the first reference voltage is equal to a first fraction of the third reference voltage, the first fraction being within 20% of ⅓, and the second reference voltage is equal to a second fraction of the third reference voltage, the second fraction being within 20% of −⅓.

According to an embodiment of the present invention, there is provided a circuit for receiving serial data, the circuit having an input for receiving an analog input signal and including: means for baud-rate clock and data recovery; and a reference voltage control circuit for controlling a first reference voltage or a second reference voltage of the means for baud-rate clock and data recovery, wherein the reference voltage control circuit includes: a first sampler for sampling the analog input signal relative to a third reference voltage; a first pattern filter to select a bit pattern including three consecutive one bits; and a first accumulator for accumulating, in a register of the first accumulator, output values of the first sampler for samples corresponding to the second bit of each pattern matched by the first pattern filter.

BRIEF DESCRIPTION OF THE DRAWINGS

These and other features and advantages of the present disclosure will be appreciated and understood with reference to the specification, claims, and appended drawings wherein:

FIG. 3C is a set of equations describing the behavior of a CTLE, according to an embodiment of the present disclosure;

DETAILED DESCRIPTION

The detailed description set forth below in connection with the appended drawings is intended as a description of exemplary embodiments of a system and method for controlling CDR and CTLE parameters provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
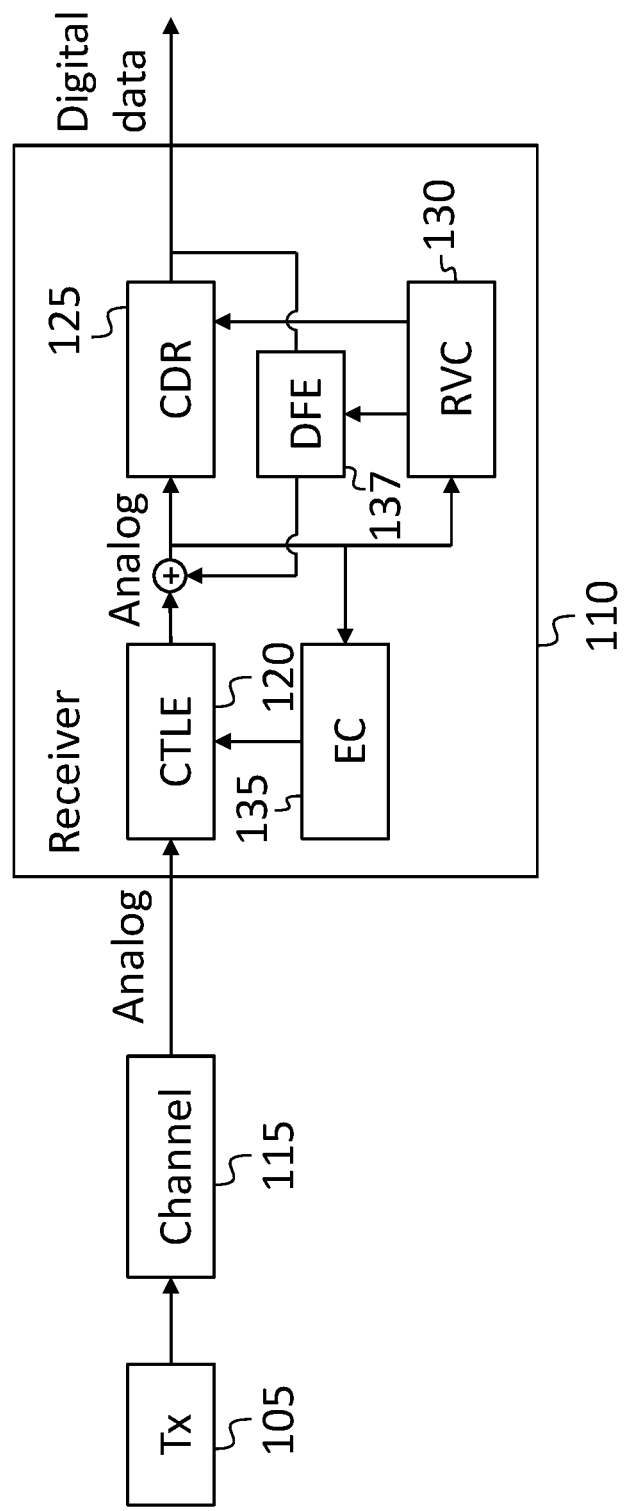
FIG. 1 is a block diagram of a system for transporting data, according to an embodiment of the present disclosure.

FIG. 1 shows a system in which digital data are transmitted form a serial transmitter 105 to a serial receiver 110. A system like that shown in FIG. 1 may be used for, or in, a display, e.g., to send video data (from a host) to the display, or within the display, to send data, over serial data links, from a timing controller to each of a plurality of driver integrated circuits. In some embodiments, the serial transmitter 105 is connected to the serial receiver 110 through a channel 115, which may cause the waveform received by the receiver 110 to differ from the waveform transmitted by the transmitter 105 (e.g., because the channel 115 may exhibit frequency dependent attenuation, with, e.g., greater attenuation at high frequencies than at low frequencies).

The serial receiver 110 may include a continuous time linear equalizer (CTLE) 120, which may also exhibit frequency-dependent attenuation (or gain) designed to partially compensate for the frequency dependent attenuation of the channel 115. The serial receiver 110 may further include a clock and data recovery circuit (CDR) 125, which may be employed to infer the phase and frequency of an embedded clock in the received signal, and to detect the data in the received signal. The continuous time linear equalizer 120 may be an analog circuit, receiving an analog signal from the channel 115, and producing an analog output signal (which is sent to the clock and data recovery circuit 125). The clock and data recovery circuit 125 may receive the analog output signal from the clock and data recovery circuit 125 and produce, as output, a stream of digital data.

The clock and data recovery circuit 125 may use, in operation, one or more reference voltages, which may be generated by a reference voltage control circuit (RVC) 130 (discussed in further detail below). The frequency response of the continuous time linear equalizer 120 may be controlled by one or more control signals; these control signals may be generated by an equalizer control circuit (EC) 135 (discussed in further detail below). A decision feedback equalizer (DFE) 137 may be used to remove the effect of the previous data on the current data. The controls of the DFE 137 may be adjusted using the reference voltage control circuit 130 as well.

Figure 2A:
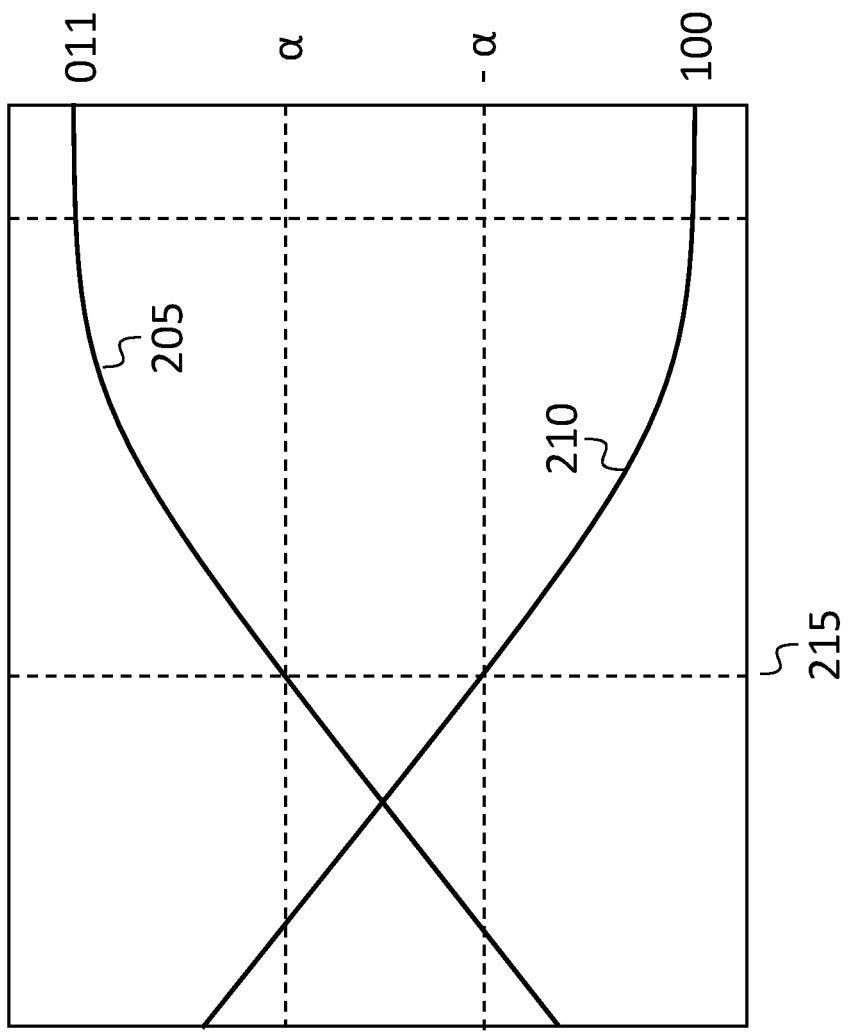
FIG. 2A is a graph of waveforms, according to an embodiment of the present disclosure.

FIG. 2A is a graph of portions of two waveforms at the output of the continuous time linear equalizer 120, a first waveform 205 corresponding to the bit sequence 011 and a second waveform 210 corresponding to the bit sequence 100. At the transition sampling point 215, the data may be inferred by comparing to the upper threshold (e.g., to a first threshold voltage) α if the preceding bit is a one, and by comparing to the lower threshold (e.g., a second threshold voltage)—α if the preceding bit is a zero. For either bit pattern, a clock phase error may be measured by determining whether the applicable threshold (e.g., the second threshold voltage, if the sequence is 100) was crossed before the clock edge (implying that the clock is late) or after the clock edge (implying that the clock is early). As such, this method of sampling the bit sequences 011 and 100 may be used for clock recovery. The use of a single clock edge to perform both clock and data recovery (instead of using two clocks separated by half of a bit period to trigger a data sampler and a crossing sampler, respectively) may be referred to as "baud-rate clock and data recovery".

Figure 2B:
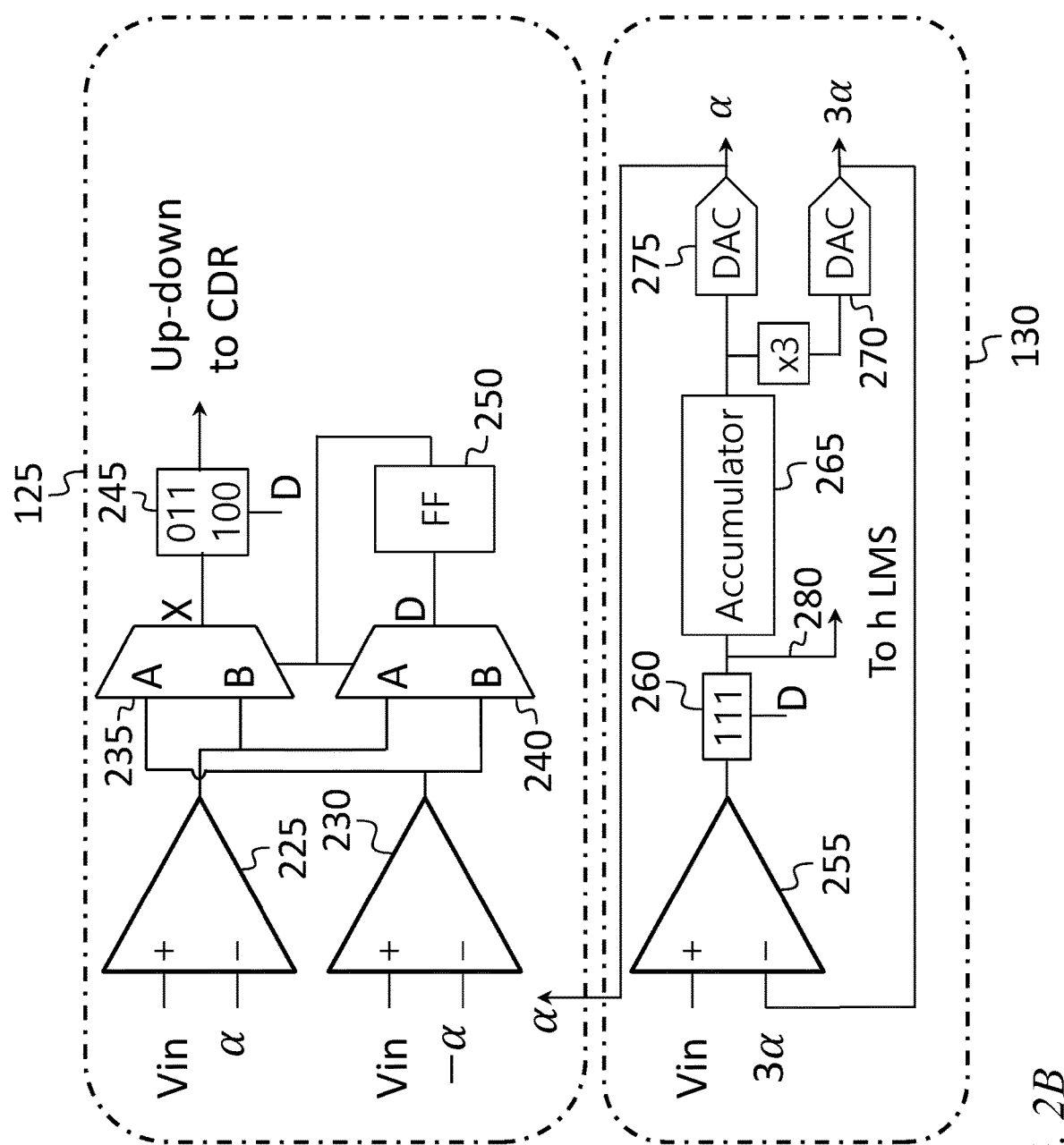
FIG. 2B is a circuit diagram of a baud-rate CDR and reference voltage control circuit, according to an embodiment of the present disclosure.

FIG. 2B shows a circuit including a baud-rate clock and data recovery circuit 125. The baud-rate clock and data recovery circuit 125 includes a first sampler 225 for sampling the analog input signal $V_{in}$ relative to the first reference voltage, a second sampler 230 for sampling the analog input signal $V_{in}$ relative to a second reference voltage (which may be approximately (but need not be precisely) equal to the opposite of the first reference voltage, as shown), a first multiplexer 235 (which operates as a crossing multiplexer), a second multiplexer 240 (which operates as a data multiplexer) a CDR pattern filter 245 that filters for the bit patterns 011 and 100, and a flip flop 250 connected to the output of the second multiplexer 240. In operation, the flip flop 250 stores the most recently received bit and selects whether (i) the first multiplexer 235 selects the output of the first sampler 225 and the second multiplexer 240 selects the output of the second sampler 230, or (ii) the first multiplexer 235 selects the output of the second sampler 230 and the second multiplexer 240 selects the output of the first sampler 225. As such, the baud-rate clock and data recovery circuit 125 (together with a circuit for controlling the phase or frequency of the clock) performs clock and data recovery as discussed above in the context of FIG. 2A.

The first and second reference voltages may be supplied to the baud-rate clock and data recovery circuit 125 by a reference voltage control circuit 130. The reference voltage control circuit 130 may include a third sampler 255 for sampling the analog input signal relative to a third reference voltage (e.g., 3*α), a pattern filter 260 (which may be referred to herein as a "first pattern filter"), a first accumulator 265, a first digital to analog converter 270 (connected to supply the third reference voltage to the third sampler 255) and a second digital to analog converter 275, which produces the output of the reference voltage control circuit 130 (for use as the first reference voltage, and (inverted) as the second reference voltage). In operation, the first accumulator 265 accumulates (in a register of the first accumulator 265) a sample from the third sampler 255 each time the pattern filter matches the pattern 111; on each such occasion, the first accumulator 265 accumulates +1 or −1 depending on the value of a sample taken at a sampling time corresponding the middle bit of the pattern 111. For example, the first accumulator 265 accumulates +1 (i.e., adds 1 to the register of the first accumulator 265, or "increments" the register by 1) if at the sampling time corresponding to the middle bit of the pattern 111 (i.e., at a sampling time corresponding to a one bit that is preceded by a one bit and followed by a one bit) the analog input signal exceeded the third reference voltage, and it "decrements" its register by 1, i.e., it accumulates −1 (which may be represented by binary 0) if, at the sampling time, the analog input signal was less than the third reference voltage.

The first pattern filter 260 may include two shift registers, a first (three bit long) shift register for storing the three most recent data bits detected, and a second (two bit long) shift register (the output of which may be connected to the input of the first accumulator 265) for storing the two most recent samples obtained by the third sampler 255. It may further include logic that tests whether the three most recent data bits detected are all ones, and that, when this occurs, activates an enable input of the first accumulator 265, so that it will, on the next clock cycle, accumulate the output of the second shift register, i.e., increment the register of the first accumulator 265 by one if the output of the second shift register is 1, and decrement the register of the first accumulator 265 by one if the output of the second shift register is 0. The scale factors of the first digital to analog converter 270 and of the second digital to analog converter 275 may differ by a factor of three as shown, so that the third reference voltage is three times the first reference voltage (e.g., 3 α), or, equivalently, the first reference voltage is one third the third reference voltage. In some embodiments, the ratios of the first reference voltage and the second reference voltage to the third reference voltage are not precisely ⅓ and −⅓ but are instead within, e.g., 20% of ⅓ and −⅓.

In operation, the third reference voltage may reach an equilibrium value at which on average the first accumulator 265 increments its register as often as it decrements its register. At a sampling time corresponding to the second bit of the bit pattern 111, the analog input signal is $h_0+h_1+h_{-1}$ (where the $h_i$ is the channel pulse response at delay of i bit periods); as such, at equilibrium, $3α=h_0+h_1+h_{-1}$. The CDR update equation for the clock and data recovery circuit 125 may be written $h_0−h_1+h_{-1}=α$; solving these two equations leads to $$α = h_1 = \frac{1}{2}(h_0 + h_{-1}).$$

As such, the reference voltage control circuit 130 may produce a first reference voltage resulting in crossings that are aligned with the sampling times when the clock phase is correct, and that therefore result in a useful clock phase error signal, which may be used to correct the clock phase.

Figure 2C:
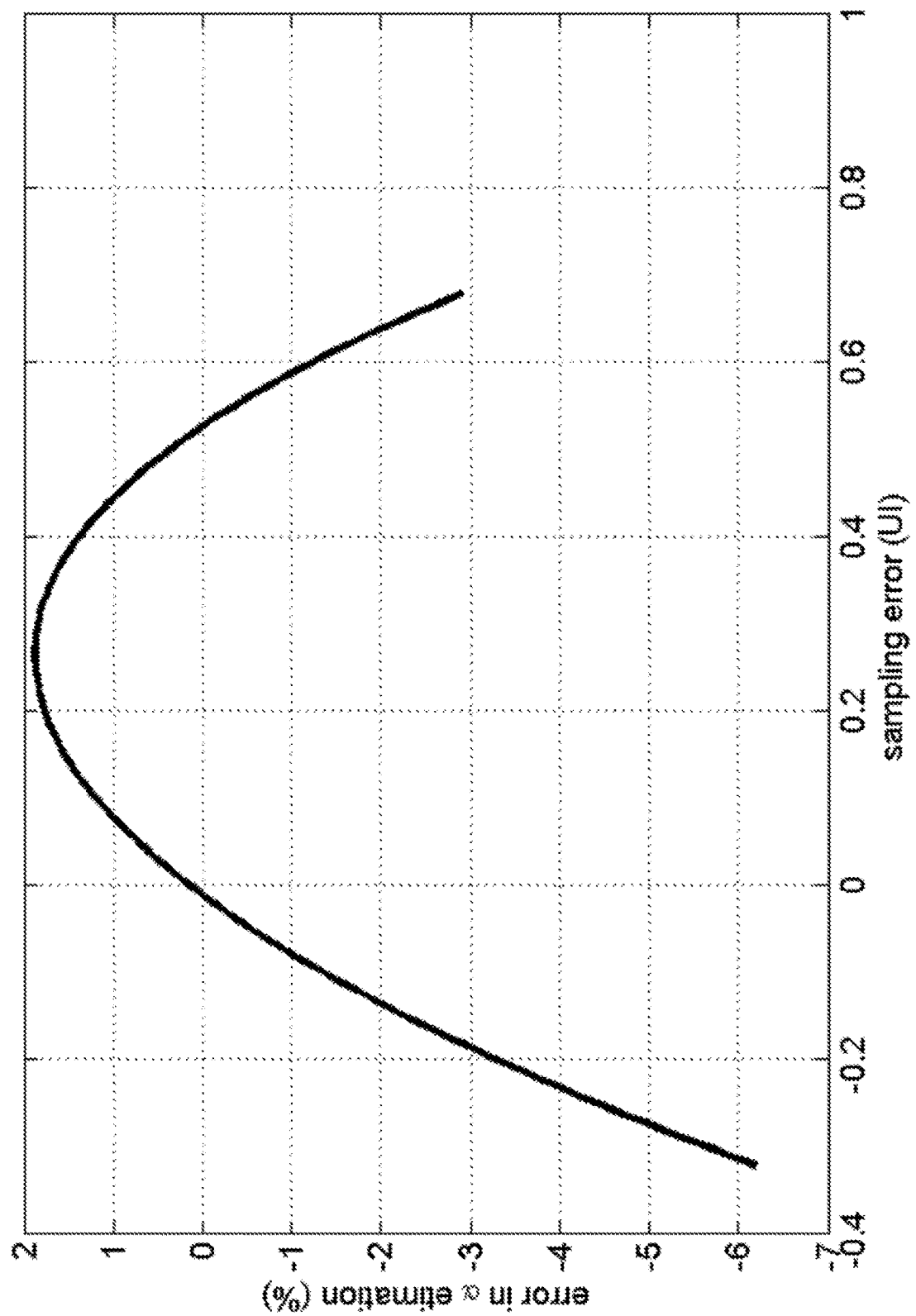
FIG. 2C is a graph of estimation error, according to an embodiment of the present disclosure.

In some embodiments, the solution of a is exact and it may work with very high loss channels (e.g., channels having loss that at the Nyquist frequency exceeds the DC loss by up to 32 dB). Neither the baud-rate clock and data recovery circuit 125 nor the reference voltage control circuit 130 requires multiple clock phases; as a result, no phase interpolators are required. The reference voltage control circuit 130 may be used with higher order DFE taps (h2 and beyond), information for which may be available at the output 280 of the first pattern filter 260. In some embodiments, adaptation of a is decoupled from CDR operation, and the reference voltage control circuit 130 does not require training sequences during startup. FIG. 2C is a graph of the estimation error in a as a function of the sampling error, showing that the output of the reference voltage control circuit 130 is tolerant to sampling errors (e.g., to sampling errors resulting from clock jitter or sampling error before CDR locking during startup).

Figure 3A:
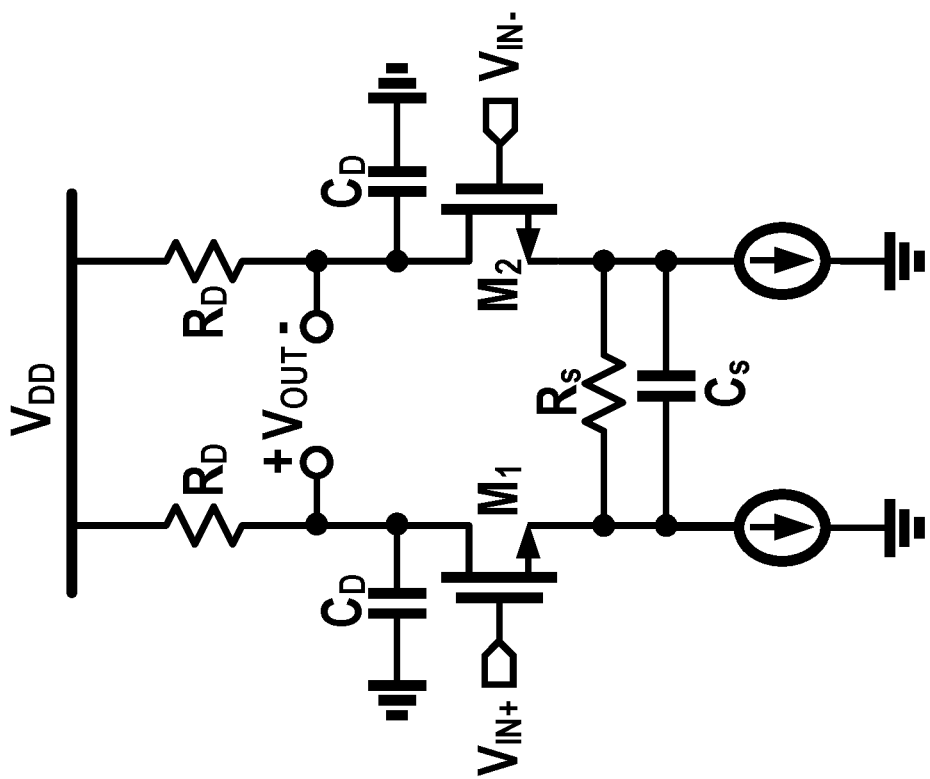
FIG. 3A is a schematic diagram of a CTLE, according to an embodiment of the present disclosure.
Figure 3B:
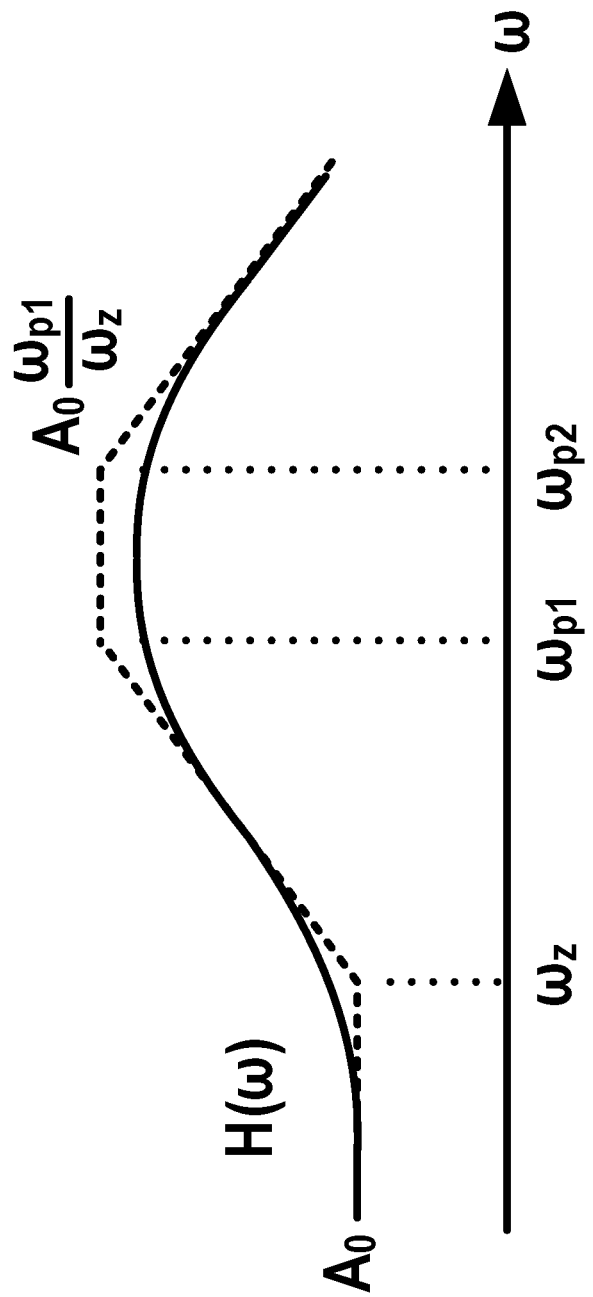
FIG. 3B is a graph of CTLE frequency response, according to an embodiment of the present disclosure.

In some embodiments, the continuous time linear equalizer 120 may, as mentioned above, be controlled by an equalizer control circuit 135. FIG. 3A shows an example of a circuit for a continuous time linear equalizer 120. In the circuit of FIG. 3A, adjustable resistor $R_s$ and adjustable capacitor $C_s$ may be controlled by suitable control signals. For example, the adjustable capacitor $C_s$ may be constructed as a bank of capacitors connected together by transistor switches, so that the adjustable capacitor Cs may be controlled, by control signals applied to the transistor switches, to include more or fewer of the capacitors in the bank. The adjustable resistor $R_s$ may similarly be implemented as a bank of resistors connected together by transistor switches, or it may be implemented as a field effect transistor in which the channel acts as a variable resistance, the resistance being adjustable by adjusting the gate voltage. FIG. 3B shows the approximate frequency response of the circuit of FIG. 3A, and FIG. 3C shows equations for the characteristics of the continuous time linear equalizer 120 of FIG. 3A.

Figure 4A:
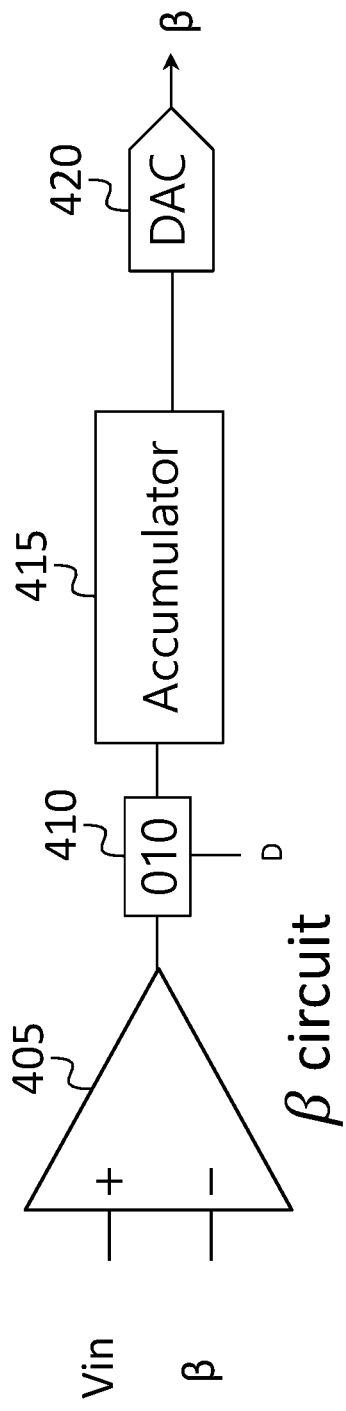
FIG. 4A is circuit diagram of a portion of an equalizer control circuit, according to an embodiment of the present disclosure.
Figure 4B:
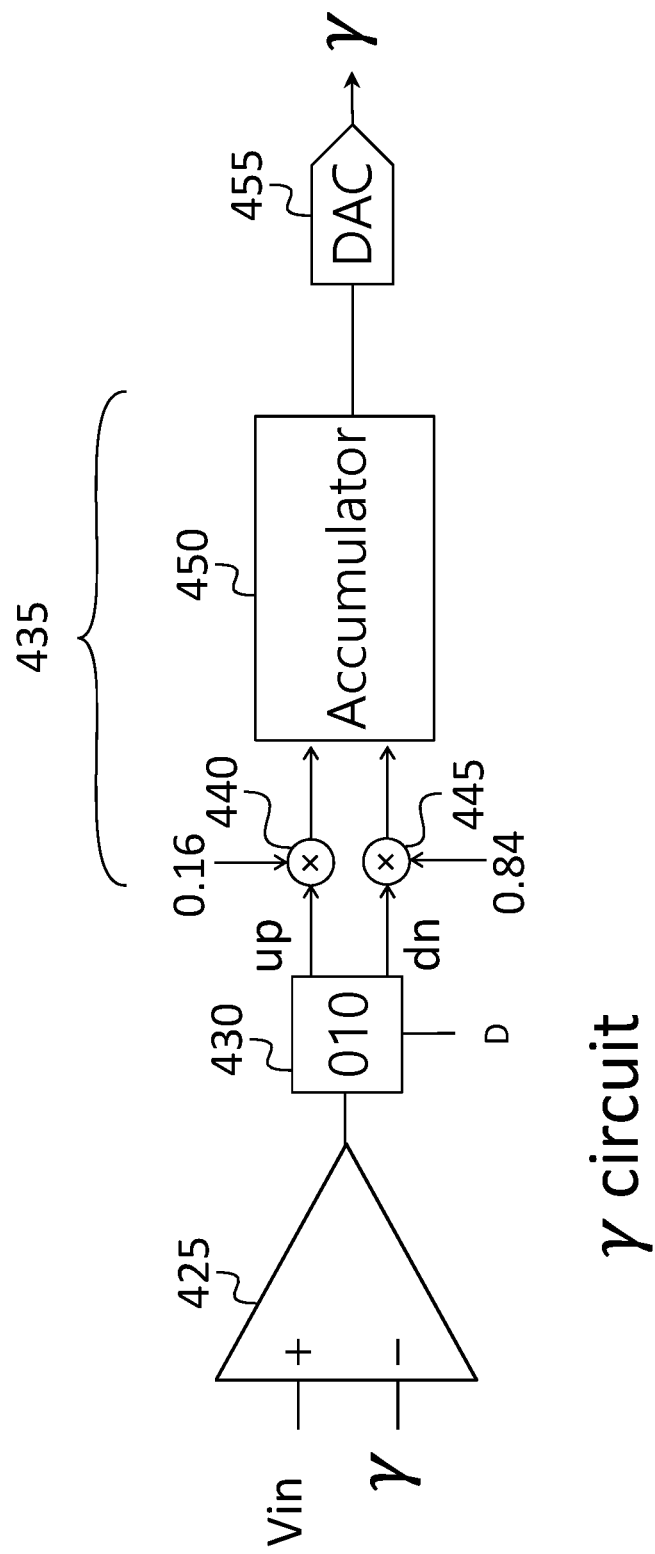
FIG. 4B is circuit diagram of a portion of an equalizer control circuit, according to an embodiment of the present disclosure.

FIG. 4A shows a circuit for generating a fourth reference voltage, and FIG. 4B shows a circuit for generating a fifth reference voltage, which together may be used to estimate the bit error rate of the serial receiver 110, as discussed in further detail below. The estimate of the bit error rate may then be employed to set one or more control parameters of the continuous time linear equalizer 120 (as discussed in further detail below).

After settling of the N DFE coefficients, $$\text{out} = D_1 h_1 + D_0 h_0 + D_{-1} h_{-1} + \Sigma_{i \neq \{-1,0,1 \ldots ,N\}} D_i h_i + v_n$$

It may be assumed that the fourth term of the above equation ($\Sigma_{i \neq \{-1, 0, 1 \ldots , N\}} D_i h_i + v_n$) has a Gaussian, or "normal" distribution (which may be denoted $N(0,\sigma)$). In this case, the bit error rate may be given by $$BER = \frac{1}{2} Q\left(\frac{h_0 - h_{-1}}{\sigma}\right) + \frac{1}{2} Q\left(\frac{h_0 + h_{-1}}{\sigma}\right) \approx \frac{1}{2} Q\left(\frac{h_0 - h_{-1}}{\sigma}\right),$$

where the Q-function is given by $$Q(x) = \frac{1}{\sqrt{2\pi}} \int_x^\infty \exp\left(-\frac{u^2}{2}\right) du.$$

It may be seen that the bit error rate is expected to be minimum when $$\left(\frac{h_0 - h_{-1}}{\sigma}\right)$$

is maximum. As such, the quantity $$\left(\frac{h_0 - h_{-1}}{\sigma}\right)$$

(and the quantity $$\frac{\beta + a}{\beta - \gamma}$$

as discussed below) may be referred to as a "bit error rate indicator".

Figure 4C:
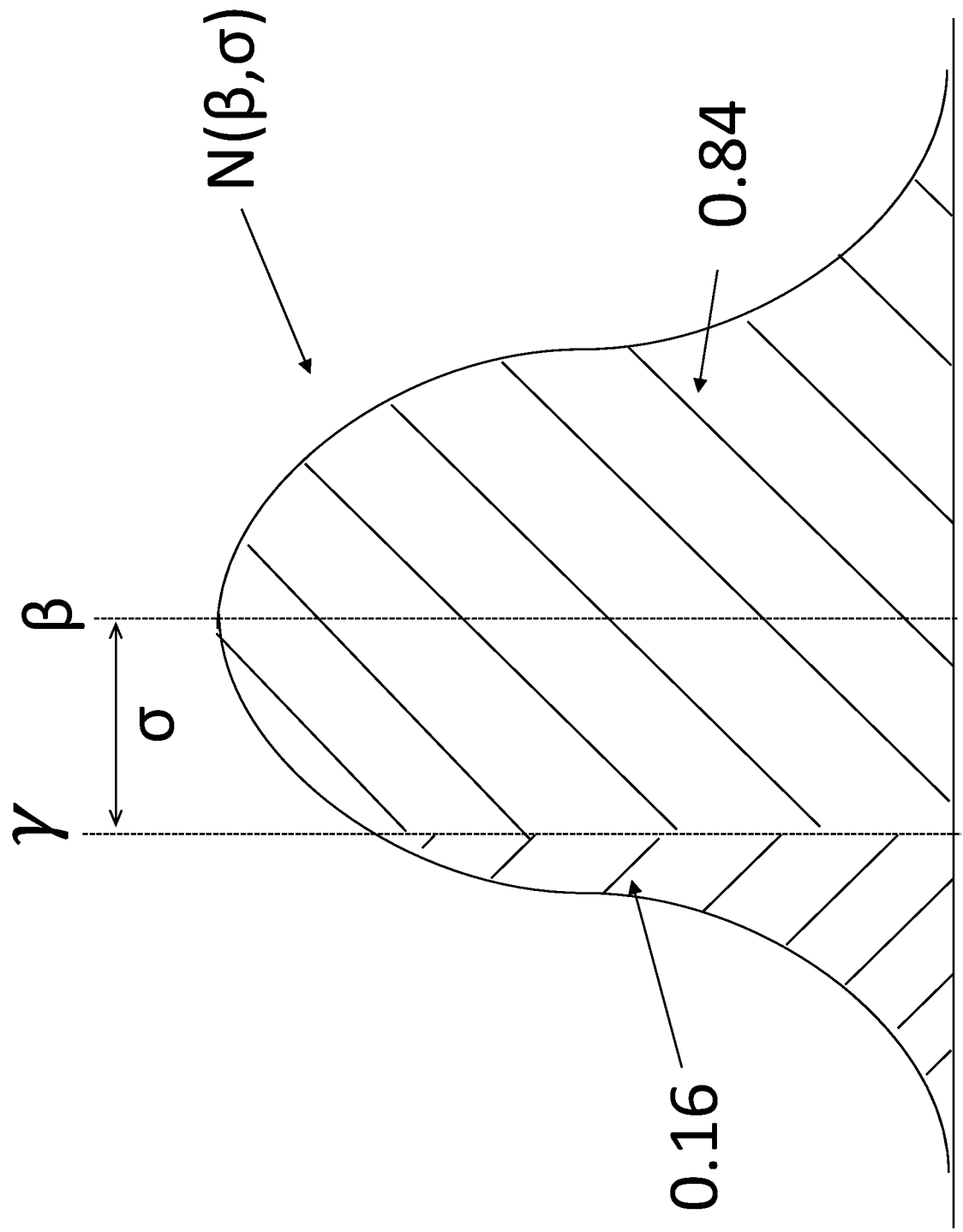
FIG. 4C is a graph of a normal distribution, according to an embodiment of the present disclosure.

The circuits of FIGS. 4A and 4B operate to estimate (as discussed in further detail below) (i) the median $\beta$ (which, for a symmetrical distribution, equals the mean) and (ii) the left one-sigma point $\gamma$ for the distribution of the analog input signal $V_{in}$ for the middle bit of the bit pattern 010. The mean and the one-sigma point have the characteristic, as shown in FIG. 4C, that for a normal distribution 16% of the probability density function falls to the left side of the left one sigma point and the remaining 84% of the distribution falls to the right of it. Because $\beta = h_0 - h_1 - h_{-1}$ and $\gamma = \beta - \sigma$, $$\frac{h_0 - h_{-1}}{\sigma} = \frac{\beta + a}{\beta - \gamma}$$

As such, the bit error rate (which, as discussed above, is a function of $$\left(\frac{h_0 - h_{-1}}{\sigma}\right))$$

may be calculated from $\alpha$, $\beta$, and $\gamma$. The equalizer control circuit 135 may then adjust the control parameters of the continuous time linear equalizer 120 so as to minimize the bit error rate, as estimated by calculating $$\frac{h_0 - h_{-1}}{\sigma} = \frac{\beta + a}{\beta - \gamma}.$$

For example, the equalizer control circuit 135 may perform an exhaustive search over all possible settings of the control parameters of the continuous time linear equalizer 120 if there are sufficiently few such settings for such an approach to be realistic; otherwise the equalizer control circuit 135 may, for example, perform a gradient descent search to find the settings that maximize $$\frac{\beta + a}{\beta - \gamma}$$

and therefore minimize the bit error rate.

As mentioned above, FIG. 4A measures the median of the distribution of the analog input signal $V_{in}$ for the middle bit of the bit pattern 010. It includes a fourth sampler 405, a second pattern filter 410, a second accumulator 415, and a digital to analog converter 420. The fourth sampler 405, the second pattern filter 410, and the second accumulator 415 are configured so that the accumulator increments its register when a sample of the analog input signal $V_{in}$, at a sampling time corresponding to the second bit of the pattern matched by the second pattern filter, exceeds a fourth reference voltage, and so that the accumulator decrements its register when the sample of the analog input signal $V_{in}$ is less than the fourth reference voltage. The second pattern filter 410 and the second accumulator 415 may constructed in a manner analogous to that described above for the first pattern filter 260 and first accumulator 265, i.e., the second pattern filter may include two shift registers and logic for causing the second accumulator 415 to increment or decrement its register when a pattern match is detected.

The circuit further includes an analog to digital converter 420, which generates the fourth reference voltage (i.e., $\beta$) from the register (i.e., based on the contents of the register) of the second accumulator 415. At equilibrium, the frequency of incrementing of the register of the second accumulator 415 is equal, on average, to the frequency of decrementing of the register of the second accumulator 415. This occurs when the fourth reference voltage is equal to the median of the distribution of the samples of the analog input signal $V_{in}$ corresponding to the middle bit of the bit pattern 010 (i.e., samples taken at the sampling time corresponding to the middle bit of the bit pattern 010).

As mentioned above, FIG. 4B measures the left one sigma point of the distribution of the analog input signal $V_{in}$ for the middle bit of the bit pattern 010. It includes a fifth sampler 425, a third pattern filter 430, a third accumulator 435, and a digital to analog converter 455. The third accumulator is a weighted accumulator, that adds to its register a weighted output value of the fifth sampler 425, with the weight being 0.16 for "up" samples, i.e., when, at the sampling time corresponding to the middle bit of the bit pattern 010, the analog input signal $V_{in}$ exceeded the fifth reference voltage, and with the weight being 0.84 for "down" samples, i.e., when, at the sampling time corresponding to the middle bit of the bit pattern 010, the analog input signal $V_{in}$ was less than the fifth reference voltage. The third pattern filter 430 and the third accumulator 435 may constructed in a manner analogous to that described above for the first pattern filter 260 and first accumulator 265, i.e., the second pattern filter may include a first shift register and a second shift register, and logic for causing the third accumulator 435 to increment its register by 0.16 or decrement its register by 0.84 (depending on whether the output of the second shift register is a 1 or a 0, respectively) when a pattern match is detected. At equilibrium, the frequency of incrementing of the register of the third accumulator 435 is equal, on average, to 0.84/0.16 times the frequency of decrementing of the register of the second accumulator 435, i.e., 0.84/0.16 of the samples exceed the fifth threshold voltage, implying that the fifth threshold voltage is one sigma to the left of the median of the distribution. The weights used may be 0.16 and 0.84 or any other weights having the same ratio, or a ratio that is within, e.g., 20% of the ratio 0.84/0.16. The register of the third accumulator 435 may store a floating-point number, or it may store a fixed point number (or, equivalently, an integer).

In some embodiments, the weights are interchanged so that the fifth reference voltage is a measurement of the right one sigma point instead of the left one sigma point, and the following equation is used:

$$\frac{h_0 - h_{-1}}{\sigma} = \frac{\beta + a}{\gamma - \beta}.$$

Figure 5A:
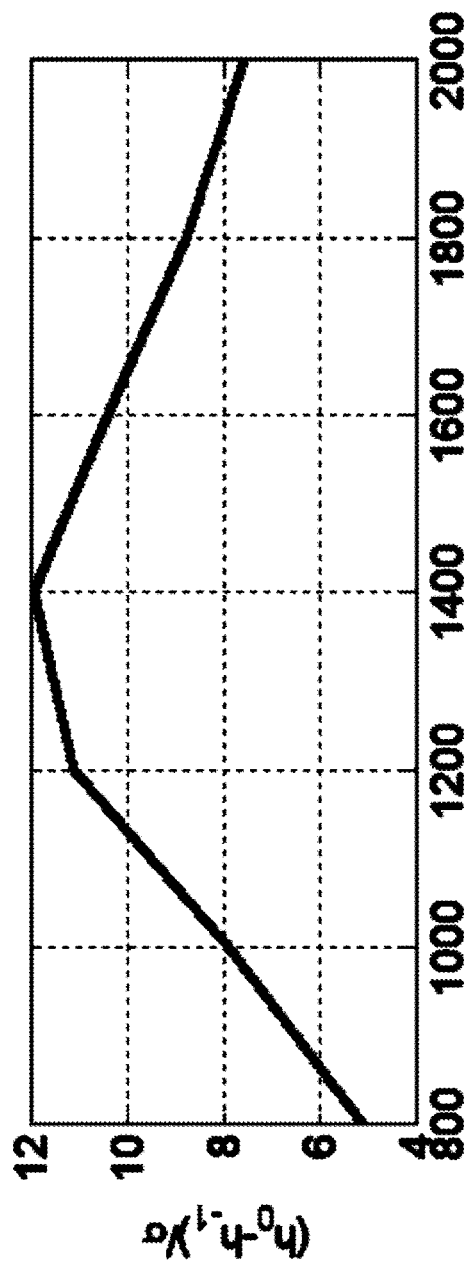
FIG. 5A is a graph of a simulation result, according to an embodiment of the present disclosure.
Figure 5B:
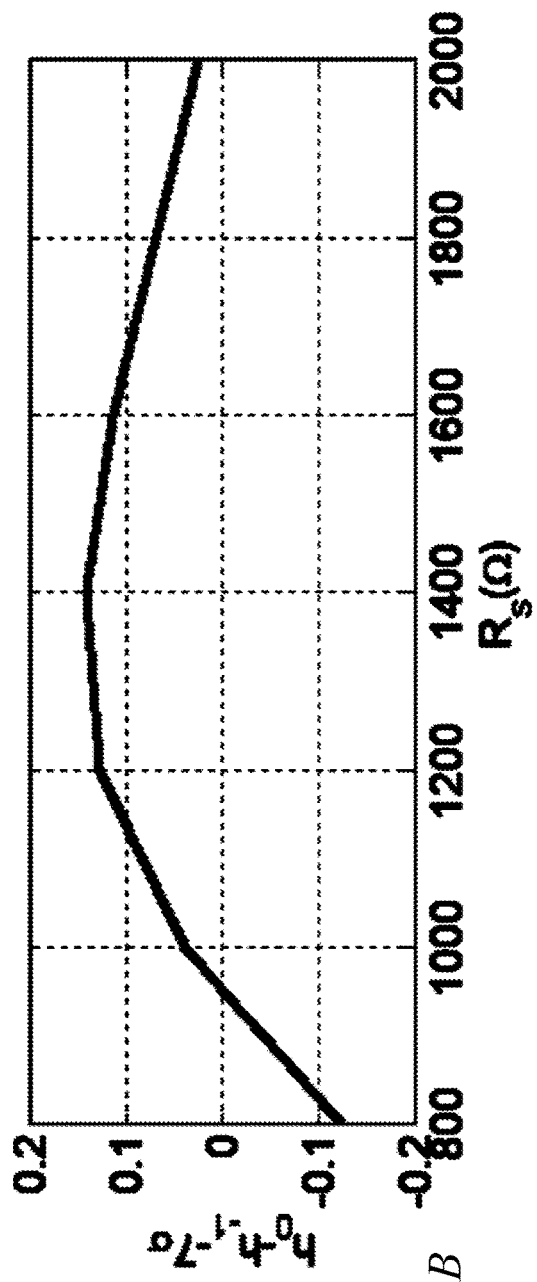
FIG. 5B is a graph of a simulation result, according to an embodiment of the present disclosure.
Figure 5C:
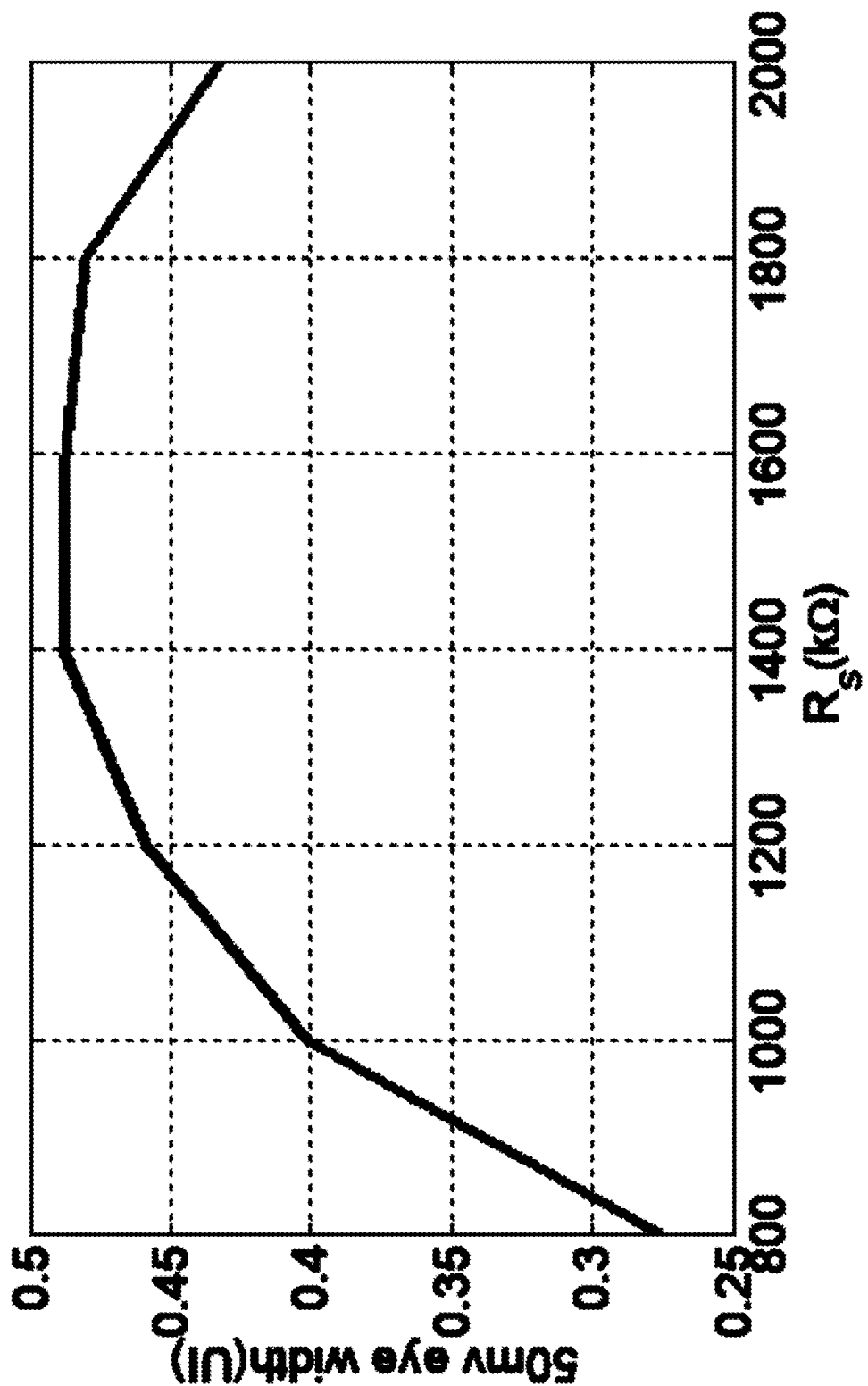
FIG. 5C is a graph of a simulation result, according to an embodiment of the present disclosure.
Figure 5D:
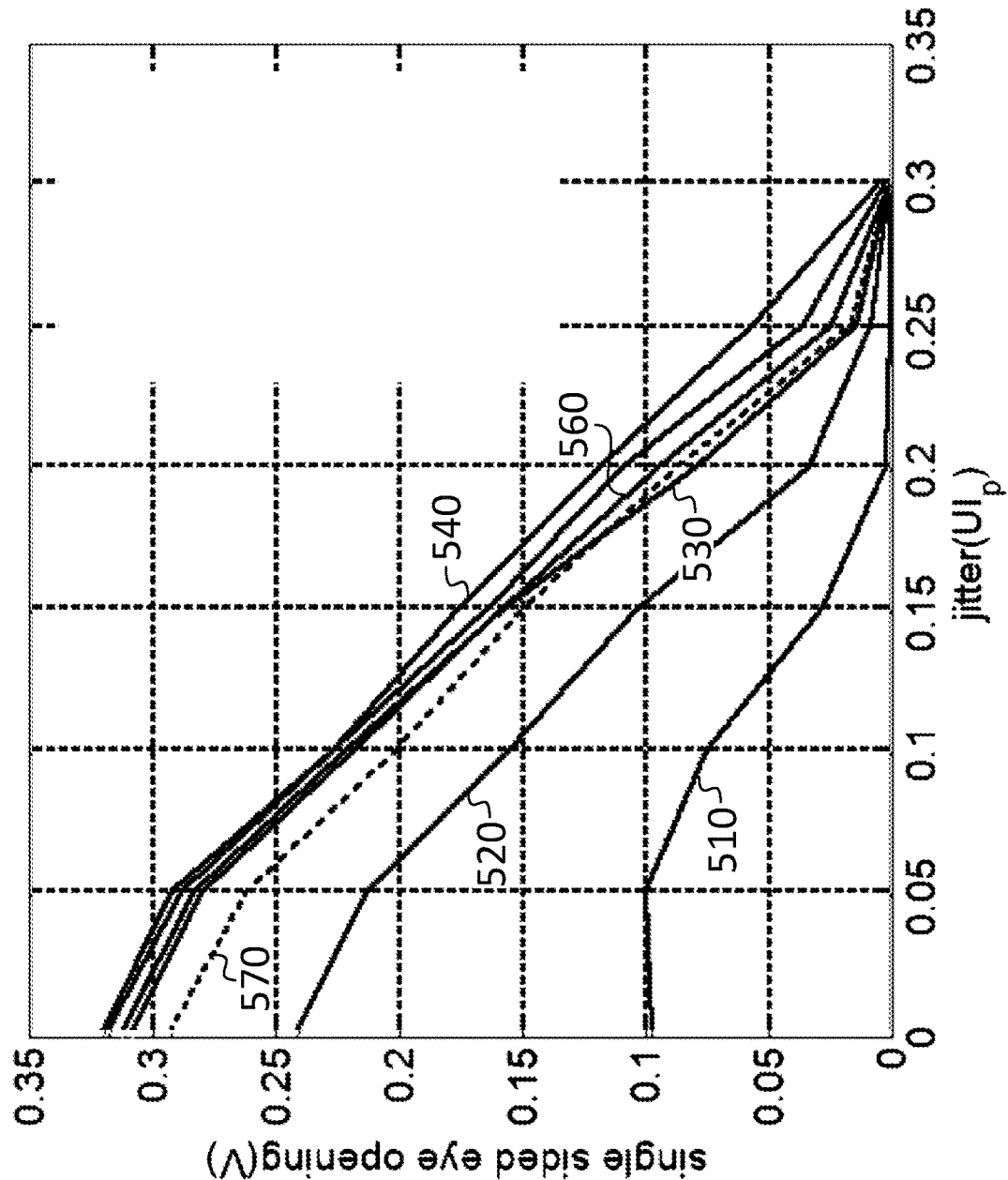
FIG. 5D is a graph of a simulation result, according to an embodiment of the present disclosure.

FIGS. 5A-5D show simulation results, for one embodiment. FIG. 5A shows the value of $$\frac{h_0 - h_{-1}}{\sigma}$$

as a function of the value of $R_s$ (the controllable resistor in the continuous time linear equalizer 120) in ohms; the setting of $R_s$ for which the lowest bit error rate is expected is 1400 ohms, in the simulation. FIG. 5B shows the eye opening as a function of the value of $R_s$ in ohms; it may be seen that the value of $R_s$ which minimizes the bit error rate also maximizes the eye opening. Similarly, the graph of FIG. 5C shows that the eye width is maximized at the value of $R_s$ which minimizes the bit error rate. FIG. 5D shows the vertical eye opening for various values of $R_s$ with sinusoidal jitter at 50 MHz. The graph contains curves numbered 510, 520, 530, 540, 550, 560 and 570 for Rs=800 ohms, 1000 ohms, 1200 ohms, 1400 ohms, 1600 ohms, 1800 ohms, and 2000 ohms, respectively.

In some embodiments a processing circuit may perform some or all of the calculations described herein; e.g., it may calculate the bit error rate indicator, and it may set the control parameters of the continuous time linear equalizer 120. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

It will be understood that a bit may be represented by a number selected from the set {0,1} or by a number selected from the set {−1, 1}, and, as such, 0 or −1 may be used interchangeably herein except where the context indicates that one or the other is used (e.g., for input to an accumulator, {−1, 1} is used). As used herein, when a second number is "within Y %" of a first number, it means that the second number is at least (1−Y/100) times the first number and the second number is at most (1+Y/100) times the first number. As used herein, the term "or" should be interpreted as "and/or", such that, for example, "A or B" means any one of "A" or "B" or "A and B". As used herein, when a method (e.g., an adjustment) or a first quantity (e.g., a first term or a first factor) is referred to as being "based on" a second quantity (e.g., a second term or a second factor) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory) as the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for controlling CDR and CTLE parameters have been specifically described and illustrated herein, many modifications and variations will be apparent to those skilled in the art. Accordingly, it is to be understood that a system and method for controlling CDR and CTLE parameters constructed according to principles of this disclosure may be embodied other than as specifically described herein. The invention is also defined in the following claims, and equivalents thereof.

What is claimed is:

1. A circuit for receiving serial data, the circuit having an input for receiving an analog input signal and comprising:
   a first sampler for sampling the analog input signal relative to a first reference voltage;
   a second sampler for sampling the analog input signal relative to a second reference voltage, the second reference voltage having a sign opposite to that of the first reference voltage; and
   a reference voltage control circuit configured to selectively adjust the first reference voltage or the second reference voltage, in response to occurrence of a pattern of three consecutive one bits and based on a first sample of the analog input signal, the first sample taken at a sampling time corresponding to a middle bit of the pattern of three consecutive one bits.

2. The circuit of claim 1, wherein the magnitude of the second reference voltage equals the magnitude of the first reference voltage.

3. The circuit of claim 1, wherein:
   the reference voltage control circuit is configured to adjust a third reference voltage based on the first sample, and
   the first reference voltage is equal to a function of the third reference voltage.

4. The circuit of claim 3, wherein the second reference voltage is equal to a function of the third reference voltage.

5. The circuit of claim 4, wherein:
   the first reference voltage is equal to a first fraction of the third reference voltage, the first fraction being within 20% of ⅓, and
   the second reference voltage is equal to a second fraction of the third reference voltage, the second fraction being within 20% of −⅓.

6. The circuit of claim 3, wherein the adjusting of the third reference voltage comprises:
   increasing the third reference voltage when the first sample is greater than the third reference voltage, and
   decreasing the third reference voltage when the first sample is less than the third reference voltage.

7. The circuit of claim 3, wherein the reference voltage control circuit comprises:
   a third sampler for sampling the analog input signal relative to the third reference voltage;
   a first pattern filter to select a bit pattern comprising three consecutive one bits; and
   a first accumulator for accumulating, in a register of the first accumulator, output values of the third sampler for samples corresponding to the second bit of each pattern matched by the first pattern filter.

8. The circuit of claim 7, wherein the output of the first pattern filter is used to adapt DFE coefficients of an order greater than 1.

9. The circuit of claim 7, wherein the reference voltage control circuit further comprises a digital to analog converter for generating the third reference voltage from the register of the first accumulator.

10. The circuit of claim 9, further comprising a continuous time linear equalizer connected to the input.

11. The circuit of claim 10, further comprising an equalizer control circuit, connected to, and configured to control one or more control parameters of, the continuous time linear equalizer.

12. The circuit of claim 11, wherein the equalizer control circuit comprises:
   a fourth sampler for sampling the analog input signal relative to a fourth reference voltage;

a second pattern filter to select a bit pattern comprising a one bit preceded by a zero bit and followed by a zero bit;

a second accumulator for accumulating, in a register of the second accumulator, output values of the fourth sampler for samples corresponding to the second bit of each pattern matched by the second pattern filter; and a digital to analog converter for generating the fourth reference voltage from the register of the second accumulator.

13. The circuit of claim 12, wherein the equalizer control circuit further comprises:

a fifth sampler for sampling the analog input signal relative to a fifth reference voltage;

a third pattern filter to select a bit pattern comprising a one bit preceded by a zero bit and followed by a zero bit;

a third accumulator for accumulating, in a register of the third accumulator, weighted output values of the fifth sampler for samples corresponding to the second bit of each pattern matched by the third pattern filter; and a digital to analog converter for generating the fifth reference voltage from the register of the third accumulator.

14. The circuit of claim 13, wherein a weight for weighting positive sampler output values is within 20% of 0.16 and a weight for weighting negative sampler output values is within 20% of 0.84.

15. The circuit of claim 14, further comprising a processing circuit configured to calculate a bit error rate indicator, based on:

the register of the first accumulator,
the register of the second accumulator, and
the register of the third accumulator.

16. The circuit of claim 15, wherein the processing circuit is configured to:

calculate the bit error rate indicator for each of a plurality of settings of the one or more control parameters of the continuous time linear equalizer, and set the control parameters to a setting for which the bit error rate indicator is greatest.

17. A circuit for receiving serial data, the circuit having an input for receiving an analog input signal and comprising:

a baud-rate clock and data recovery circuit; and a reference voltage control circuit for controlling a first reference voltage or a second reference voltage of the baud-rate clock and data recovery circuit, wherein the reference voltage control circuit comprises:

a first sampler for sampling the analog input signal relative to a third reference voltage;

a first pattern filter to select a bit pattern comprising three consecutive one bits; and a first accumulator for accumulating, in a register of the first accumulator, output values of the first sampler for samples corresponding to the second bit of each pattern matched by the first pattern filter.

18. The circuit of claim 17, wherein the reference voltage control circuit further comprises a digital to analog converter for generating the third reference voltage from the register of the first accumulator.

19. The circuit of claim 18, wherein:

the first reference voltage is equal to a first fraction of the third reference voltage, the first fraction being within 20% of $\frac{1}{3}$, and the second reference voltage is equal to a second fraction of the third reference voltage, the second fraction being within 20% of $-\frac{1}{3}$.

20. A circuit for receiving serial data, the circuit having an input for receiving an analog input signal and comprising:

means for baud-rate clock and data recovery; and a reference voltage control circuit for controlling a first reference voltage or a second reference voltage of the means for baud-rate clock and data recovery, wherein the reference voltage control circuit comprises:

a first sampler for sampling the analog input signal relative to a third reference voltage;

a first pattern filter to select a bit pattern comprising three consecutive one bits; and a first accumulator for accumulating, in a register of the first accumulator, output values of the first sampler for samples corresponding to the second bit of each pattern matched by the first pattern filter.

* * * * *